United States Patent
Mochizuki (10) Patent No.: US 6,753,915 B1
(45) Date of Patent: Jun. 22, 2004

(54) PHOTOELECTRIC CONVERSION APPARATUS AND IMAGE PICKUP APPARATUS HAVING AN OPTIMALLY POSITIONED DRIVING WIRE

(75) Inventor: Chiori Mochizuki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/396,880

(22) Filed: Sep. 16, 1999

(30) Foreign Application Priority Data

Sep. 21, 1998 (JP) ............................................ 10-266663

(51) Int. Cl.⁷ ............................ H04N 3/14; H04N 5/335
(52) U.S. Cl. ........................ 348/302; 257/292; 257/448; 250/208.1
(58) Field of Search .......................... 348/313, 77, 302; 257/292, 428, 458, 459, 448; 250/208.1

(56) References Cited

U.S. PATENT DOCUMENTS

| | | | | |
|---|---|---|---|---|
| 4,499,331 A | * | 2/1985 | Hamakawa et al. | 257/458 |
| 4,665,278 A | * | 5/1987 | Takada et al. | 257/458 |
| 5,032,884 A | * | 7/1991 | Yamagishi et al. | 257/458 |
| 5,254,868 A | * | 10/1993 | Saito | 257/448 |
| 5,435,608 A | * | 7/1995 | Wei et al. | 257/292 |
| 5,507,881 A | * | 4/1996 | Sichanugrist et al. | 257/458 |
| 5,838,054 A | * | 11/1998 | Kwasnick et al. | 257/292 |
| 5,965,872 A | * | 10/1999 | Endo et al. | 250/208.1 |

* cited by examiner

Primary Examiner—Wendy R. Garber
Assistant Examiner—Matthew L Rosendale
(74) Attorney, Agent, or Firm—Fitzpatrick, Cella, Harper & Scinto.

(57) ABSTRACT

A photoelectric conversion apparatus has a plurality of photoelectric conversion elements (photodiodes 4), a plurality of switching elements (TFTs 3) connected to the respective photoelectric conversion elements 4, a plurality of signal lines 5 for outputting electric signals resulting from photoelectric conversion in each of the photoelectric conversion elements 4, and a plurality of driving wires (bias lines 6) for driving the photoelectric conversion elements 4. In the photoelectric conversion apparatus, each of the driving wires 6 is arranged in parallel to the signal lines 5 and between the signal lines 5 and each of the driving wires 6 is located so that a center line thereof lies between a first position at a center between the signal lines 5 and a second position at a center of gravity of an area of the photoelectric conversion element 4, thereby enhancing photosensitivity.

26 Claims, 9 Drawing Sheets

BIAS LINE POSITION

FIG. 10

ITO FILM THICKNESS (KÅ)

PHOTOELECTRIC CONVERSION APPARATUS AND IMAGE PICKUP APPARATUS HAVING AN OPTIMALLY POSITIONED DRIVING WIRE

BACKGROUND OF THE INVENTION

1. Field of the Invention

The present invention relates to a photoelectric conversion apparatus and, more particularly, to a photoelectric conversion apparatus which is used as an image information input means such as a scanner, a digital copier, or the like and in which pixels, each pixel being constructed using a photoelectric conversion element and a switching element, are arrayed one-dimensionally or two-dimensionally, and an image pickup apparatus using it.

2. Related Background Art

Reading systems making use of a demagnifying optical system and a CCD sensor have been used heretofore as information reading systems (image information input means) of facsimile devices, digital copiers, X-ray image pickup apparatus, etc.; or popularly utilized image reading devices are those provided with a reading system having photoelectric conversion elements using a photoelectric conversion semiconductor material typified by hydrogenated amorphous silicon (hereinafter referred to as a—Si), and switching elements.

Particularly, a—Si can be formed uniformly and at low temperature over a substrate of a large area. This presents the advantage of capability of being formed on an inexpensive glass substrate, and it is thus applied widely.

It is known that pin photodiodes can be used for the photoelectric conversion elements of the photoelectric conversion apparatus described above and TFTs can be suitably applicable to the switching elements.

For example, '94 SPIE Vol. 2127, P144–P151 describes that the photoelectric conversion apparatus is sensitive to even weak light and the dynamic range (DR) achieved is $10^4$ to $10^5$. It is, however, described that DR is greatly affected by noise such as random noise, thermal noise, and the like. Further, '97 SPIE Vol. 3032, P2–P13 introduces an X-ray digital detector as an application example of the photoelectric conversion apparatus of this type.

The X-ray digital detector is equipped with a fluorescent substance such as CsI or the like or a fluorescent sheet such as $Gd_2O_2S$ or the like for converting an X-ray image to a visible image, and the photoelectric conversion apparatus for receiving light emitted from the fluorescent sheet.

Figure 1:
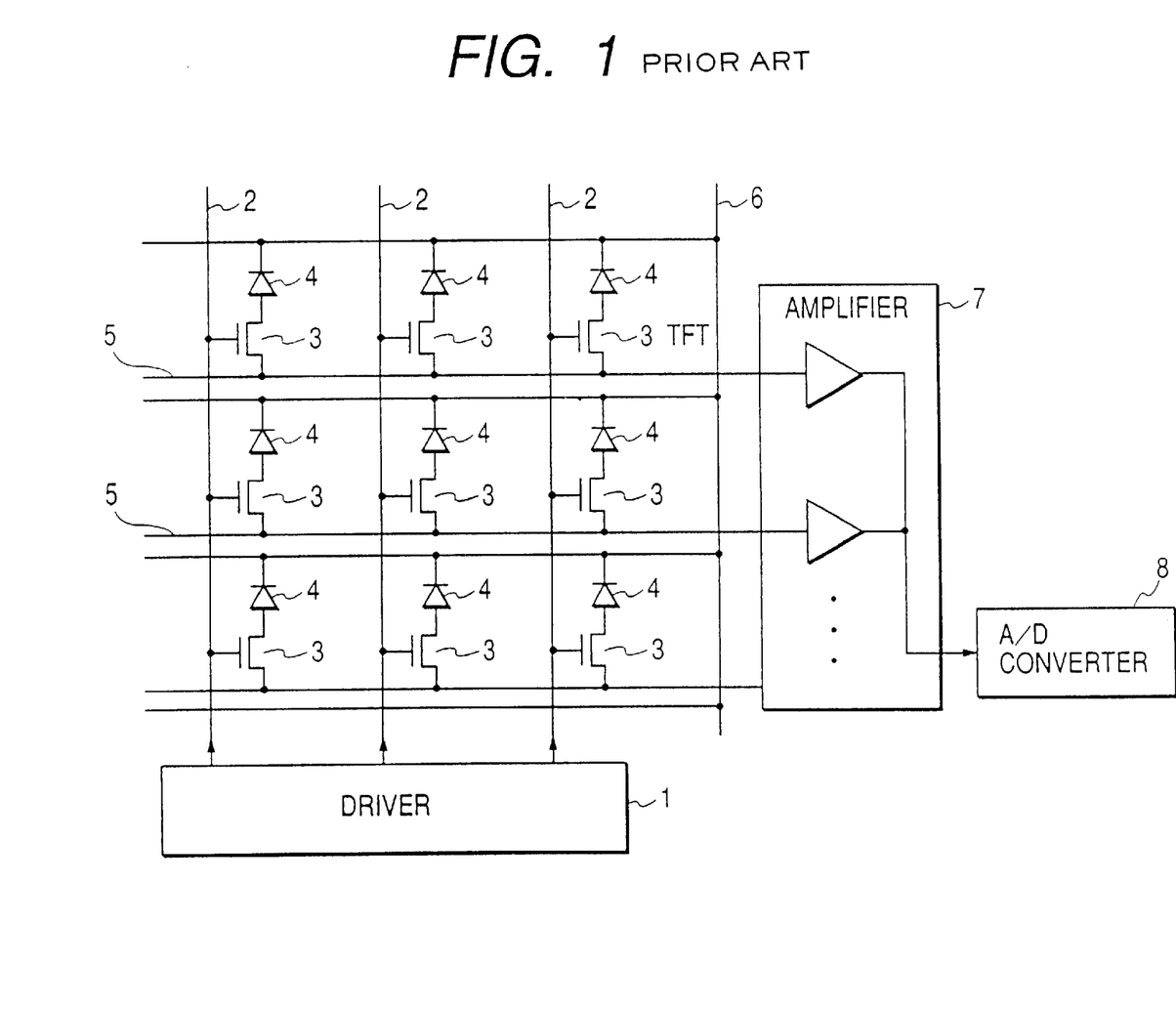
FIG. 1 is a schematic, equivalent circuit diagram of a photoelectric conversion apparatus.
Figure 2:
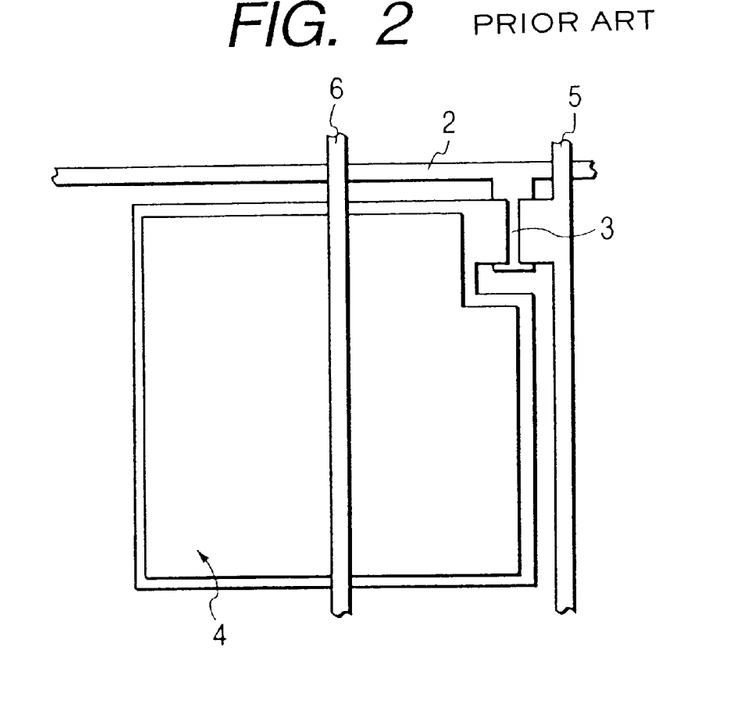
FIG. 2 is a schematic plan view of one pixel in the photoelectric conversion apparatus.
Figure 3:
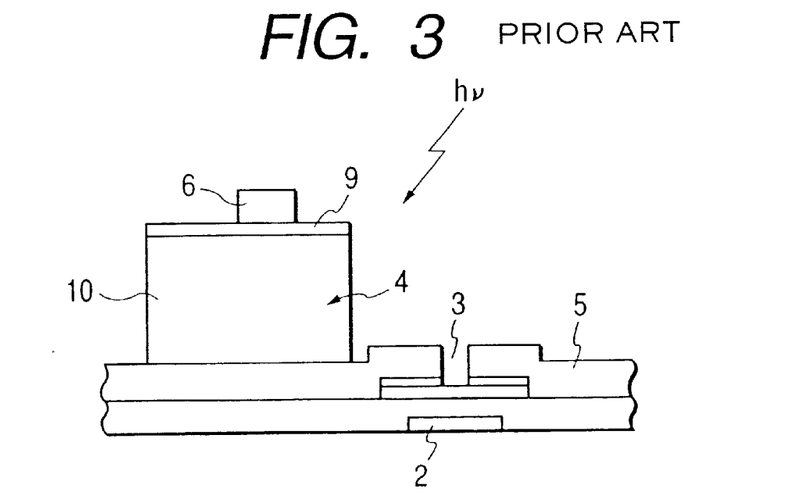
FIG. 3 is a schematic, cross-sectional view of one pixel in the photoelectric conversion apparatus.

FIG. 1 is a schematic, equivalent circuit diagram for explaining an example of the X-ray digital detector. FIG. 2 is a schematic plan view of one pixel in the photoelectric conversion apparatus forming the X-ray digital detector and FIG. 3 a schematic crosssectional view thereof. A driver 1 of FIG. 1 is connected via gate lines 2 to TFTs 3 as switches. Radiated X-rays are converted into light in a sensitive wavelength region by the fluorescent sheet placed on pin photodiodes 4 as photoelectric conversion elements, and the light is incident to the pin photodiodes 4, as illustrated in FIG. 3.

The light incident to each photodiode 4 travels through a transparent electrode 9 and further undergoes photoelectric conversion in a semiconductor layer 10; more specifically, the light travels, for example, through a p-type layer and then undergoes the photoelectric conversion in an i-type a—Si layer; whereby the light signal is converted into an electric signal. The charge resulting from the photoelectric conversion is stored in the photodiode 4.

Charges stored in the respective photodiodes 4 are outputted via signal lines 5 to an amplifier 7 by successively turning the TFTs 3 on by a control signal from the driver 1. Then the amplifier 7 amplifies the electric signals and an A/D converter 8 executes A/D conversion thereof to output digital signals to a computer or the like not illustrated. A backward bias is applied through bias line 6 to the photodiodes 4.

The computer carries out image processing to display the input image signals on a monitor or the like or to record the data in a recording medium or the like.

Figure 4:
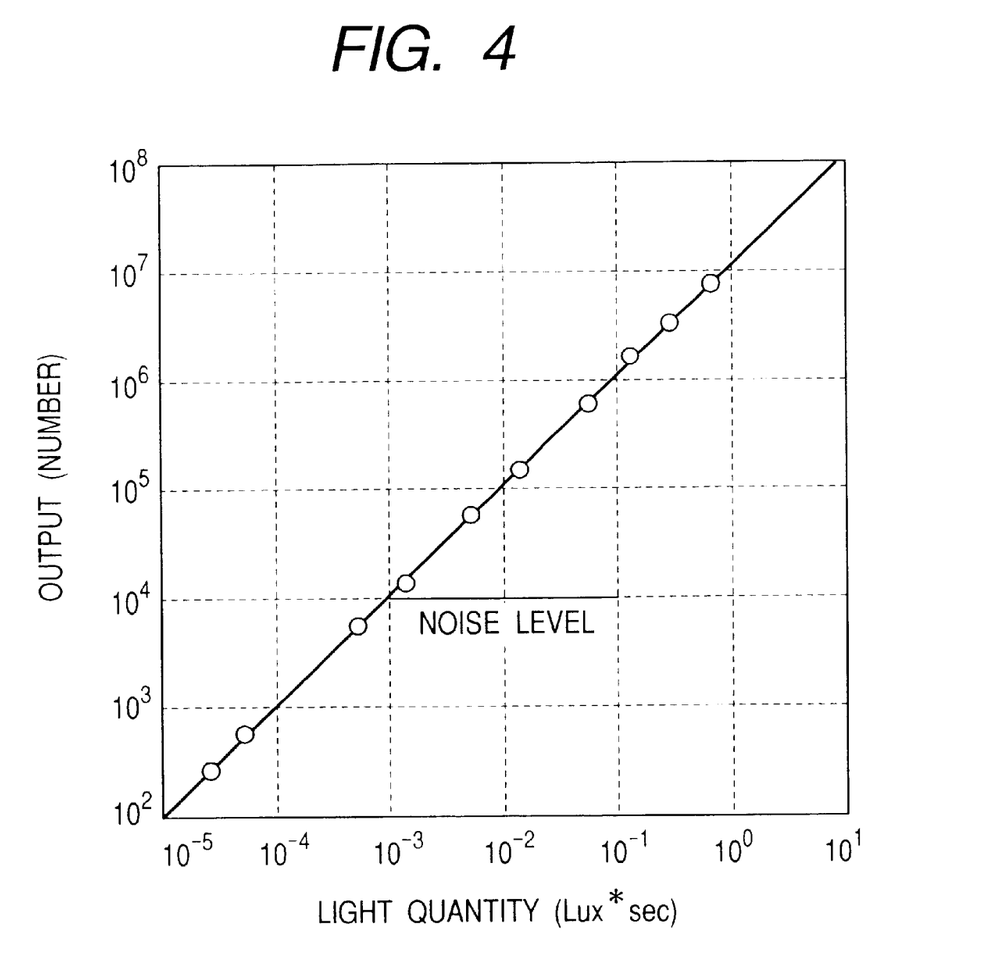
FIG. 4 is a diagram to show an example of the relationship of the number of output electrons versus quantity of incident light.

Incidentally, there are strong desires for increase in the photosensitivity of the photodiodes in the photoelectric conversion apparatus as described above. Particularly, in the case of the X-ray image pickup apparatus, the increase of sensitivity directly results in the significant advantage of capability of decreasing an X-ray dose, and is thus a challenge to be solved soon. FIG. 4 shows an example of the relationship between quantity of light received by the photodiodes and output of electric signal from the sensors. This figure shows the sensors that can be used in the range of light quantity of $10^{-3}$ to 1, and the demand is to make them able to be used, for example, in the range of $10^{-4}$ to 1.

In order to enhance the photosensitivity of the photodiodes, a variety of studies have been made, including increasing an aperture rate of pixels, suppressing noise components in the electric signals by decreasing wiring capacitance, and so on.

There was, however, a limit to increasing the aperture rate of pixels, because the size of the TFTs was determined in consideration of their transfer performance of stored charges. Since the area of crossing portions between the gate line and the signal lines was determined in consideration of the production yield etc., there was also a limit to decreasing the wire-to-wire capacitance by decreasing the wiring width.

SUMMARY OF THE INVENTION

An object of the present invention is to enhance the photosensitivity of the photodiodes.

Another object of the present invention is to provide a photoelectric conversion apparatus comprising a plurality of photoelectric conversion elements, a plurality of switching elements connected to said respective photoelectric conversion elements, a plurality of signal lines for outputting electric signals resulting from photoelectric conversion in each of said photoelectric conversion elements, and a plurality of driving wires for driving said photoelectric conversion elements, wherein each of said driving wires is arranged in parallel to said signal lines and between said signal lines and wherein each of said driving wires is located so that a center line thereof lies between a first position, which is a center between said signal lines, and a second position, which is a center of gravity of an area of said photoelectric conversion element.

Another object of the present invention is to provide an image pickup apparatus comprising: a photoelectric conversion apparatus comprising a plurality of photoelectric conversion elements, a plurality of switching elements connected to said respective photoelectric conversion elements, a plurality of signal lines for outputting electric signals resulting from photoelectric conversion in each of said photoelectric conversion elements, and a plurality of driving wires for driving said photoelectric conversion elements; and wavelength conversion means placed on the light incidence side of said photoelectric conversion apparatus, for effecting conversion of incident wavelength and putting light resulting from the wavelength conversion into said photoelectric conversion apparatus, wherein each of said driving wires is arranged in parallel to said signal lines and between said signal lines and wherein each of said driving wires is located so that a center line thereof lies between a first position, which is a center between said signal lines, and a second position, which is a center of gravity of an area of said photoelectric conversion element.

Still another object of the present invention is to provide a photoelectric conversion apparatus comprising a plurality of photoelectric conversion elements arrayed in a matrix of rows and columns, each of said photoelectric conversion elements having a transparent electrode disposed on the light incidence side and an electrode opposed to said transparent electrode through a semiconductor layer, first conductive lines connected to the transparent electrodes and disposed along the rows or the columns of the photoelectric conversion elements, and a plurality of second conductive lines provided adjacent to the photoelectric conversion elements and along the first conductive lines, wherein each of the first conductive lines lies between a first position passing through a center between the second conductive lines and in parallel to the second conductive lines and a second position passing through a center of gravity of a light receiving area of the photoelectric conversion element and in parallel to the second conductive lines.

Still another object of the present invention is to provide an image pickup apparatus comprising: a photoelectric conversion apparatus comprising a plurality of photoelectric conversion elements arrayed in a matrix of rows and columns, each of said photoelectric conversion elements having a transparent electrode disposed on the light incidence side and an electrode opposed to said transparent electrode through a semiconductor layer, first conductive lines connected to the transparent electrodes and disposed along the rows or the columns of the photoelectric conversion elements, and a plurality of second conductive lines provided adjacent to the photoelectric conversion elements and along the first conductive lines, wherein each of the first conductive lines lies between a first position passing through a center between the second conductive lines and in parallel to the second conductive lines and a second position passing through a center of gravity of a light receiving area of the photoelectric conversion element and in parallel to the second conductive lines; and a wavelength conversion element for effecting wavelength conversion of an image-information-carrying signal put into each of the photoelectric conversion elements.

In the present invention the thickness of the transparent electrode or the area of the transparent electrode can be made smaller by properly setting arrangement of the bias wire, whereby the photosensitivity of the sensor is enhanced.

As illustrated in FIG. 2 and FIG. 3, the bias line 6 for applying the bias to the photodiode 4 is provided on the transparent electrode 9 located on the pin photodiode 4. However, the position of the bias line 6 can be anywhere on the transparent electrode 9, and it was not specified particularly.

The present invention is based on such a finding that the sensitivity of photodiodes can be enhanced by giving consideration to the placement location of the bias line 6 (driving line).

Namely, the photosensitivity can be enhanced by optimizing the placement of the driving line, without any substantial change in the layer structure itself of the elements.

The optimization of placement of the driving line permits the uniform bias to be applied to the photoelectric conversion elements. This in turn permits decrease in the thickness of the transparent electrode, so as to decrease an amount of transparent electrode's absorption of light incident to the photoelectric conversion element, thus increasing the utilization efficiency of light. This can increase the photosensitivity of the photoelectric conversion elements.

The recognition of the importance of placement of the driving line leads to adequate control of the position of the driving line in each element, which decreases variations in characteristics among the elements. The present invention can thus provide the photoelectric conversion apparatus with excellent characteristics. This can then improve the total performance of the image pickup apparatus having the photoelectric conversion apparatus, such as the X-ray image pickup apparatus or the like.

DESCRIPTION OF THE PREFERRED EMBODIMENTS

Embodiment 1

Figure 5:
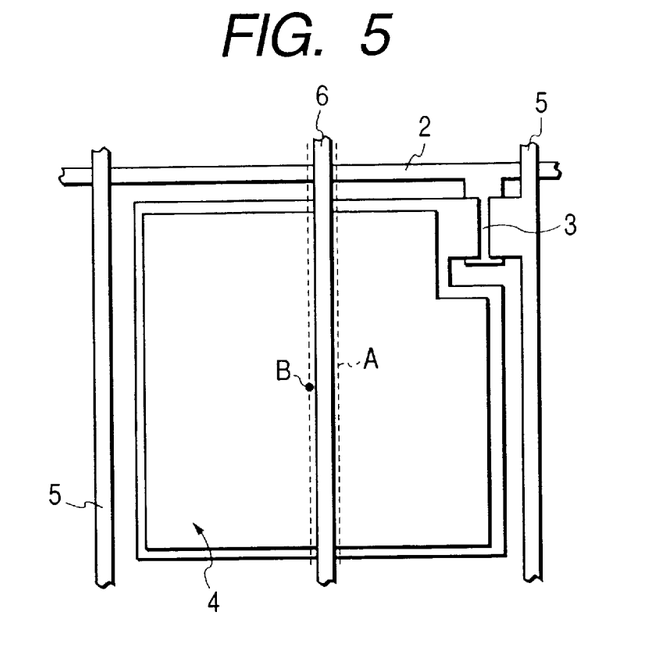
FIG. 5 is a schematic plan view of one pixel in a photoelectric conversion apparatus.

The first embodiment of the photoelectric conversion apparatus according to the present invention will be described referring to FIG. 5. FIG. 5 is a diagram to show a pixel in the photoelectric conversion apparatus of the present embodiment. The pixel is composed of a TFT 3 as a switch, and a photodiode 4. Such pixels are arrayed two-dimensionally and the array pitch of the pixels is, for example, 160 $\mu$m.

A gate line 2 is connected to the TFT 3. The TFT 3 is turned on by a signal supplied via the gate line 2 from the driver (not illustrated), whereby the charge resulting from the photoelectric conversion is outputted from the photodiode 4 to a signal line 5.

Described next is the operation of the pixels in the photoelectric conversion apparatus of the present embodiment. The incident light passes through the transparent electrode (not illustrated) (which will be called ITO) provided on the pin photodiode 4 and further passes through the p-type layer of the photodiode 4 to be subjected to the photoelectric conversion in the i-type a—Si layer, whereby the light signal is converted into an electric signal. The charge is stored in the photodiode 4.

The charges stored in the respective photodiodes 4 are outputted through the signal lines 5 to the amplifier (not illustrated) by successively turning the TFTs 3 on by the control signal from the driver (not illustrated). Then the amplifier amplifies the electric signals and the A/D converter (not illustrated) carries out the A/D conversion of the electric signals. The image signals are processed by an image processing device (not illustrated).

In activation of the photoelectric conversion apparatus the bias is applied to each sensor (photodiode) 4 through the bias line 6. At that time a bias application state to the sensor 4 varies depending upon the film thickness of ITO (not illustrated). Therefore, there are cases wherein the photosensitivity becomes lowered, depending upon the film thickness of ITO.

Figure 6:
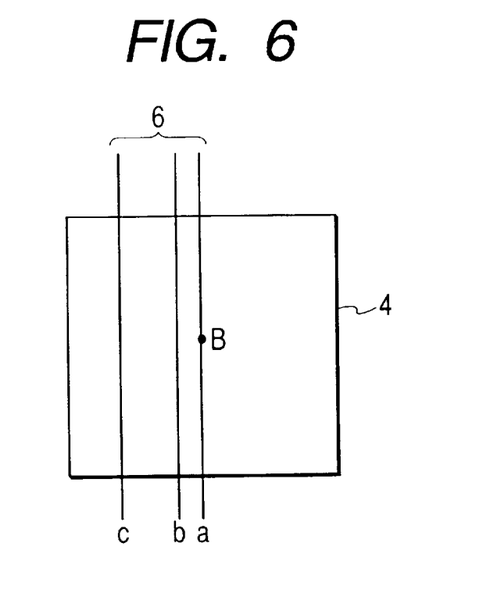
FIG. 6 is a diagram to show an example of placement locations of a bias line.
Figure 7:
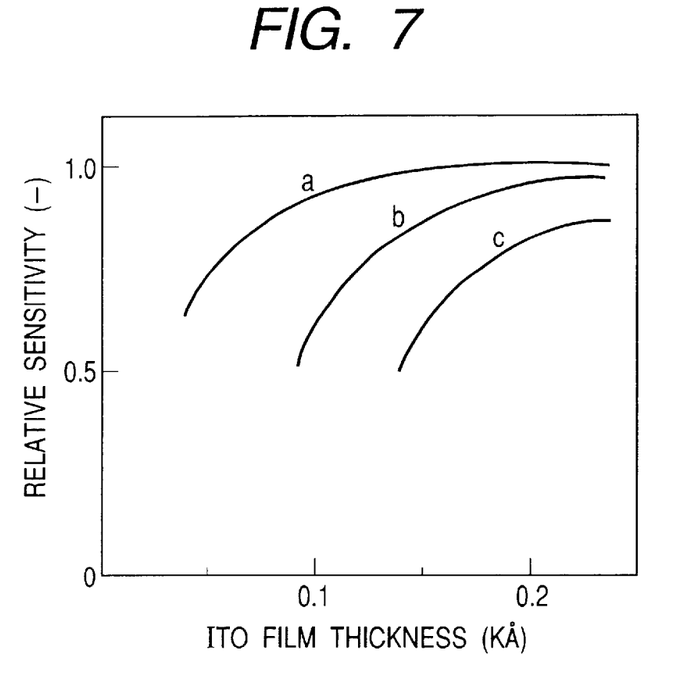
FIG. 7 is a diagram to show an example of the relationship of ITO film thickness versus sensitivity at the locations of the bias line.

Here FIG. 6 is a diagram to show a placement example of the bias line at different locations on the photodiode. FIG. 7 is a diagram to show the results of measurement in which the photosensitivity of the sensor 4 was measured at each of the locations of the bias line in FIG. 6, against a parameter of the film thickness of ITO. The quantity of the incident light to the photodiode 4 is constant, independent of the locations of the bias line 6.

In FIG. 6, the wiring location (a) of the bias line passes through the center of gravity B of the area of the sensor 4 and the wiring locations (b), (c) pass through a position apart from the center of gravity B of the area of the sensor 4. As illustrated in FIG. 7, when the wiring location of the bias line 6 is the wiring location passing through the center of gravity of the photodiode 4, i.e., through the wiring location (a), the photosensitivity of the sensor is the highest. The position of the center of gravity of the sensor is the position of a point at which the area of the light receiving region of the sensor is bisected by a border of the x-axis or the y-axis, for example, where the y-axis is taken along a direction parallel to the signal line and the x-axis along a direction perpendicular to the signal line. Of course, the reference can also be based on the pixels arrayed in a matrix and, in that case, a column of pixels can be taken as the y-axis and a row of pixels as the x-axis.

Figure 8:
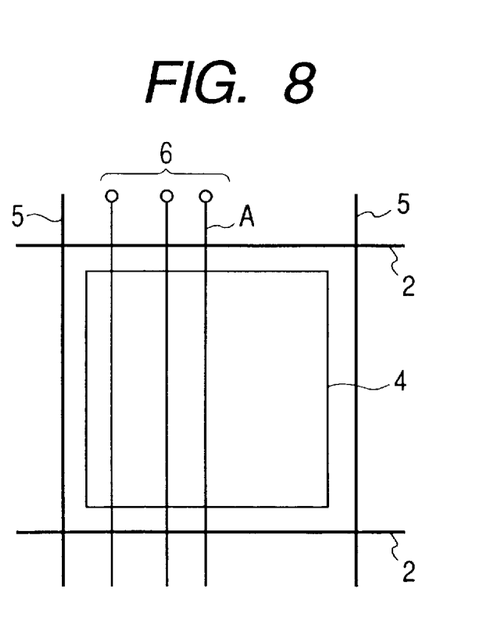
FIG. 8 is a diagram to show an example of placement locations of a bias line with consideration to signal lines.
Figure 9:
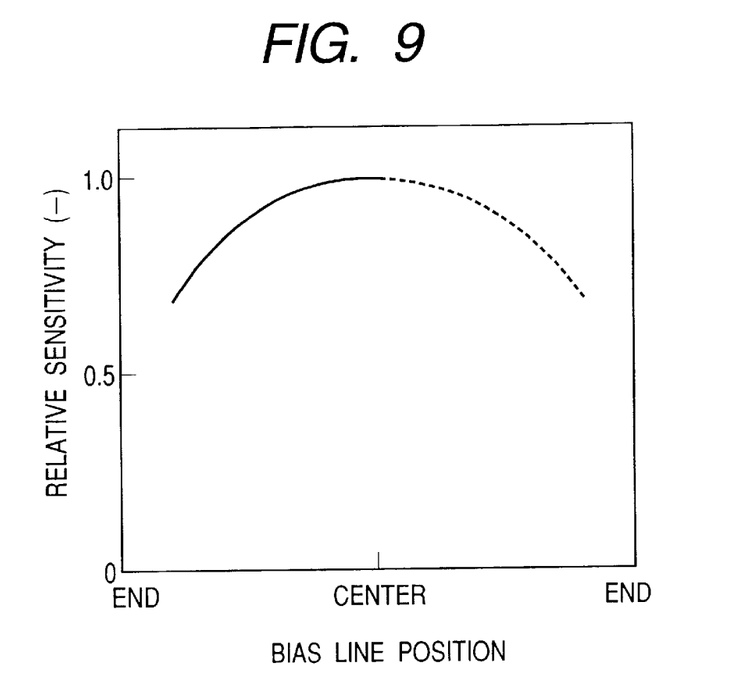
FIG. 9 is a diagram to show an example of the relationship of position of bias line versus sensitivity.

Next, the relationship between the photosensitivity of the sensor 4 and the wiring layout of the bias line 6 will be described referring to FIG. 8 and FIG. 9. FIG. 8 is a diagram to show a placement example of the bias line 6 at different locations on the photodiode 4. FIG. 9 is a diagram to show the results of measurement in which the photosensitivity of the sensor 4 was measured at each of the locations of the bias line 6 shown in FIG. 8, against a parameter of the placement location to the signal lines.

As illustrated in FIG. 9, the photosensitivity of the photodiode 4 is affected by the location of the bias line 6 between the adjacent signal lines. As the bias line 6 is located closer to the edge between the adjacent signal lines, capacitive coupling becomes greater between the bias line 6 and the signal line. This increases the noise in the signal and in turn decreases DR.

In addition, leak current increases as the bias line 6 is located closer to the edge between the adjacent signal lines. This also increases the noise in the signal and in turn decreases DR. Therefore, the most preferable location of the bias line 6 is the center A between the adjacent signal lines.

In FIG. 5, the bias line 6 is located so that the center line thereof lies between a dashed line A indicating the center between the two adjacent signal lines 5 and a dashed line passing through the center of gravity B of the area of the photodiode 4 and in parallel to the signal lines 5. It is a matter of course that the bias line 6 is placed, most preferably, at the center between the dashed line A and the dashed line passing through the point B.

This arrangement can balance the first effect of capability of applying the adequate bias to the whole of the sensor 4 with the second effect of decreasing the noise in the signal by lowering. the capacitance between the bias line and the signal lines well, even in the case of the large resistance due to the small film thickness of ITO, and thus enjoy the both effects sufficiently, whereby the photosensitivity of the sensor 4 can be enhanced.

Figure 10:
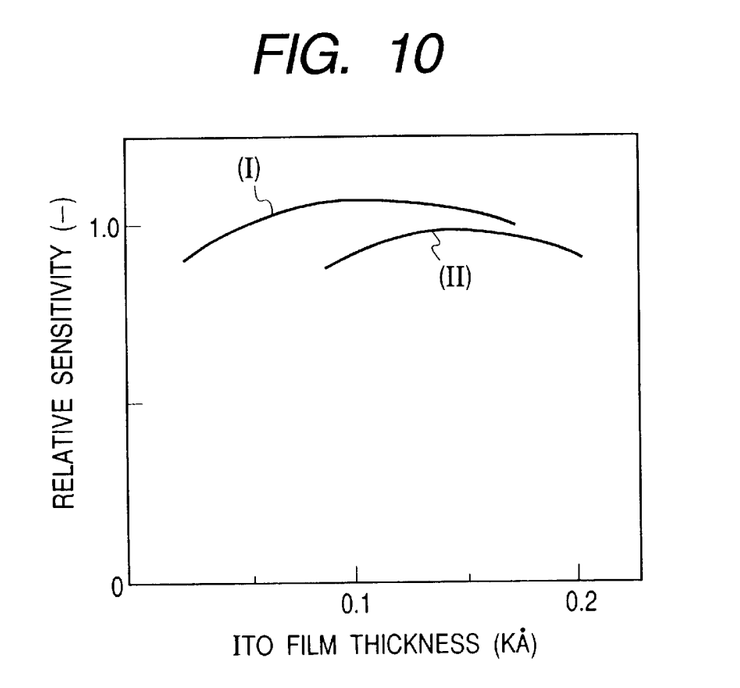
FIG. 10 is a diagram to show an example of the relationship of ITO film thickness versus sensitivity.

FIG. 10 shows the relationship between ITO film thickness and photosensitivity of the sensor at the location (I) of the bias line according to the present invention and at the location (II) of the bias line shifted toward the signal line side. It is seen from FIG. 10 that the location (I) of the bias line according to the present invention permits a decrease in the film thickness of ITO and a further improvement in the photosensitivity of the sensor.

Embodiment 2

Next, the second embodiment of the photoelectric conversion apparatus according to the present invention will be described referring to FIG. 11. The photoelectric conversion apparatus of the present embodiment is constructed using the electrode (ITO 9) having a smaller area than the light receiving portion of the photoelectric conversion element. Since the structure of the bias lines 6, the signal lines not illustrated, etc. is just as described in Embodiment 1, the description thereof is omitted herein. The bias line 6 is placed between the center between the adjacent signal lines and the center of gravity of the area of the photoelectric conversion element, as in embodiment 1.

The application of the bias to the ITO 9 can be accomplished adequately by changing the location of the bias line 6 as described above. Thanks to it, the desired bias can be applied to the whole of the photodiode 4 because of leakage of an electric field even if the area of ITO is decreased by about 10 $\mu$m. The area of ITO 9 can be determined giving consideration to a spread of the electric field from the ITO 9 to the photodiode 4 or to the function as an electrode of the p-type layer. Specifically, the ITO 9 can be made smaller by about 10 pm in the periphery.

Figure 11:
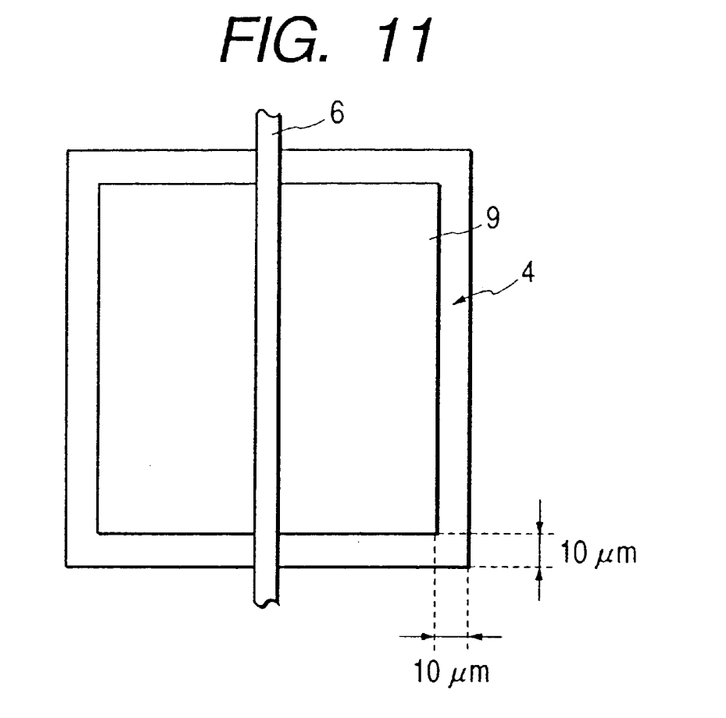
FIG. 11 is a schematic plan view of one pixel in a photoelectric conversion apparatus.

As illustrated in FIG. 11, the ITO 9 can be one having the smaller area than the photodiode 4. Therefore, the quantity of light absorbed by the ITO 9 can be decreased more, so that the utilization efficiency of the incident light to the sensor 4 can be increased further, thereby enhancing the photosensitivity still more.

The ITO 9 can also be formed in a mesh shape in order to increase the quantity of light absorbed by the sensor by decreasing the quantity of light absorbed by the ITO 9. This can also accomplish the same effect as in the case where the area of the ITO 9 is decreased as described above. In this case the size of hole portions in the mesh shape is preferably 10 μm square or smaller in consideration of the spread of the electric field.

Similarly, the bias line can be placed directly on the p-type layer or on the n-type layer without the ITO 9 if the p-type layer or the n-type layer has a sufficient resistance. At this time, it is further possible to effect element-to-element isolation between the sensors by only the p-type layer. Namely, the apparatus can also be constructed in structure without the ITO 9. Therefore, the element-to-element isolation by only the p-type layer permits a further increase in the quantity of the light absorbed by the sensor, as being the case in the above. This structure also permits formation of the photoelectric conversion apparatus using the thin sensors with high photosensitivity.

An X-ray image pickup apparatus can be constructed by placing a fluorescent sheet for converting an X-ray image into an optical image as a wavelength conversion element on the light incidence side of the photoelectric conversion apparatus of the above embodiments.

Figure 12:
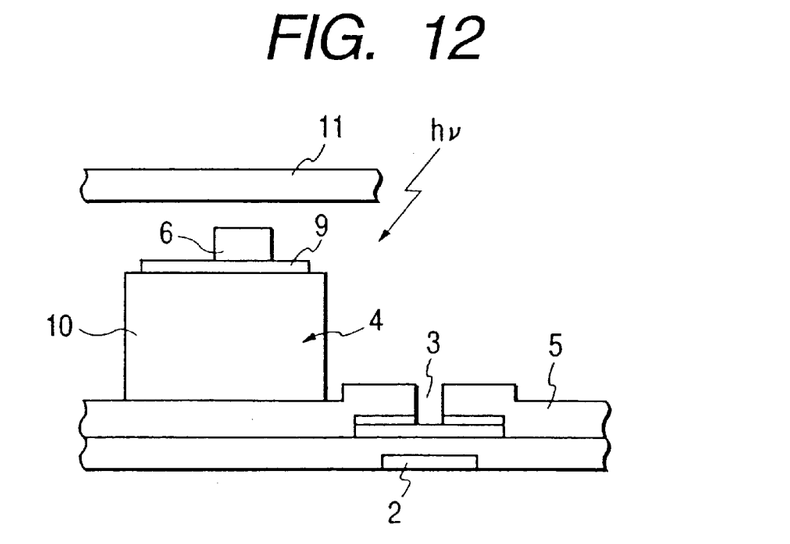
FIG. 12 is a schematic, cross-sectional view for explaining the relationship between a wavelength conversion element and a photoelectric conversion element.

FIG. 12 is a schematic, cross-sectional view of an example in which the wavelength conversion element is placed. The wavelength conversion element is placed at least corresponding to the necessary light receiving area. When the light source is an X-ray source, the wavelength conversion element can be any material that can convert X-rays to light in the sensitive wavelength region of the photoelectric conversion elements. Fluorescent substances are preferably used as the wavelength conversion element in general. The fluorescent substances applicable herein are CsI, CaWO$_4$, Gd$_2$O$_2$SiTb, and so on.

An example of a system wherein the photoelectric conversion apparatus of the present invention is applied to an image pickup apparatus for X-rays will be described briefly.

Figure 13A:
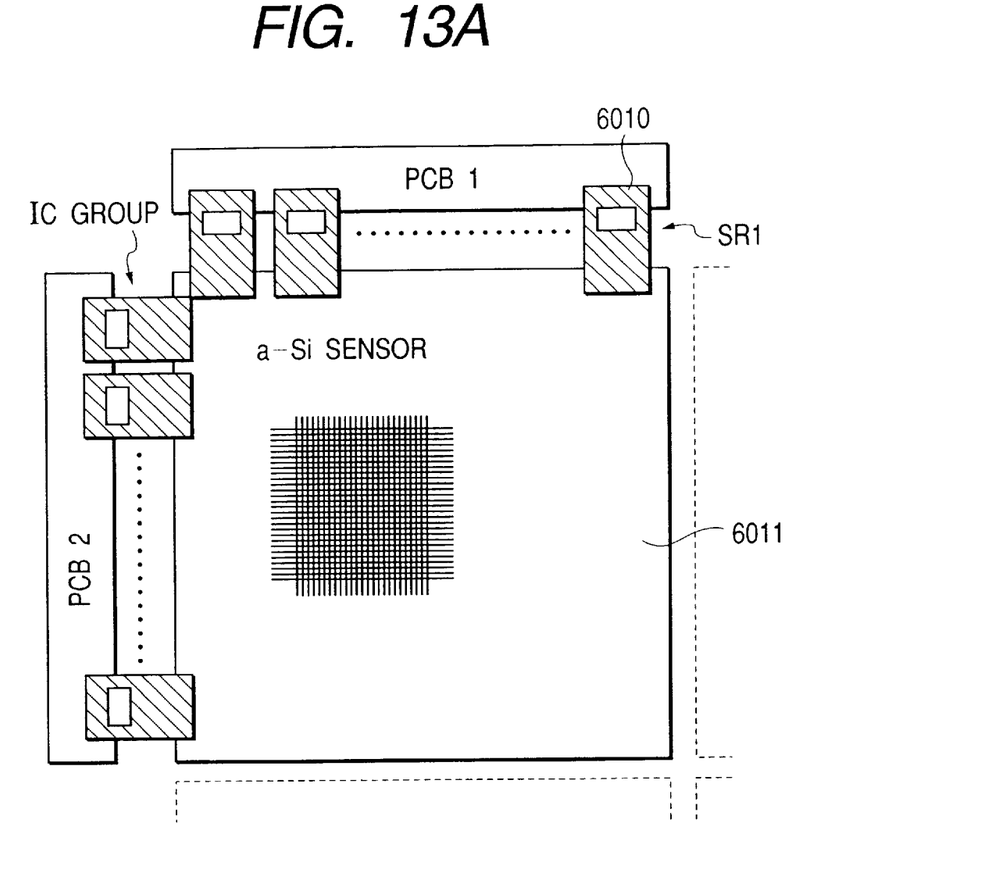
FIG. 13A is a schematic plan view of an image pickup apparatus.
Figure 13B:
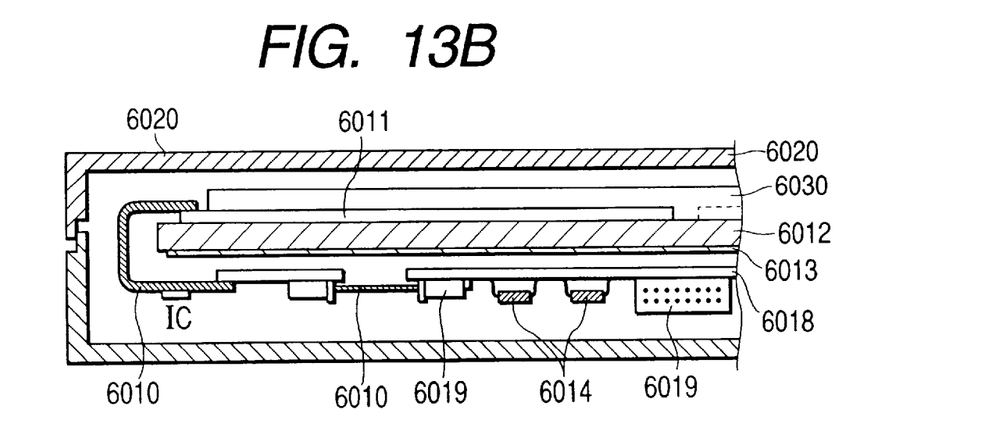
FIG. 13B is a schematic, cross-sectional view of the image pickup apparatus.

FIG. 13A and FIG. 13B are a schematic, structural diagram and a schematic, cross-sectional view of the example wherein the present invention is applied to the image pickup apparatus for detection of X-rays.

A plurality of photoelectric conversion elements and TFTs are formed in an a—Si sensor substrate 6011 and are connected to flexible circuit boards 6010 in each of which a shift register SR1 or an integrated circuit IC for detection is mounted. The other side of the flexible circuit boards 6010 is connected to a circuit board PCB1 or PCB2. A plurality of such a—Si sensor substrates 6011 are bonded onto a base 6012 to form a large photoelectric conversion apparatus. Below the base 6012 a lead sheet 6013 is mounted for protecting memories 6014 in a processing circuit 6018 from X-rays. A fluorescent substance 6030, for example CsI, is applied or glued as a wavelength conversion element for converting the X-rays into visible light, onto the a—Si sensor substrates 6011. In this example the whole is housed in a carbon fiber case 6020, as illustrated in FIG. 13B.

Figure 14:
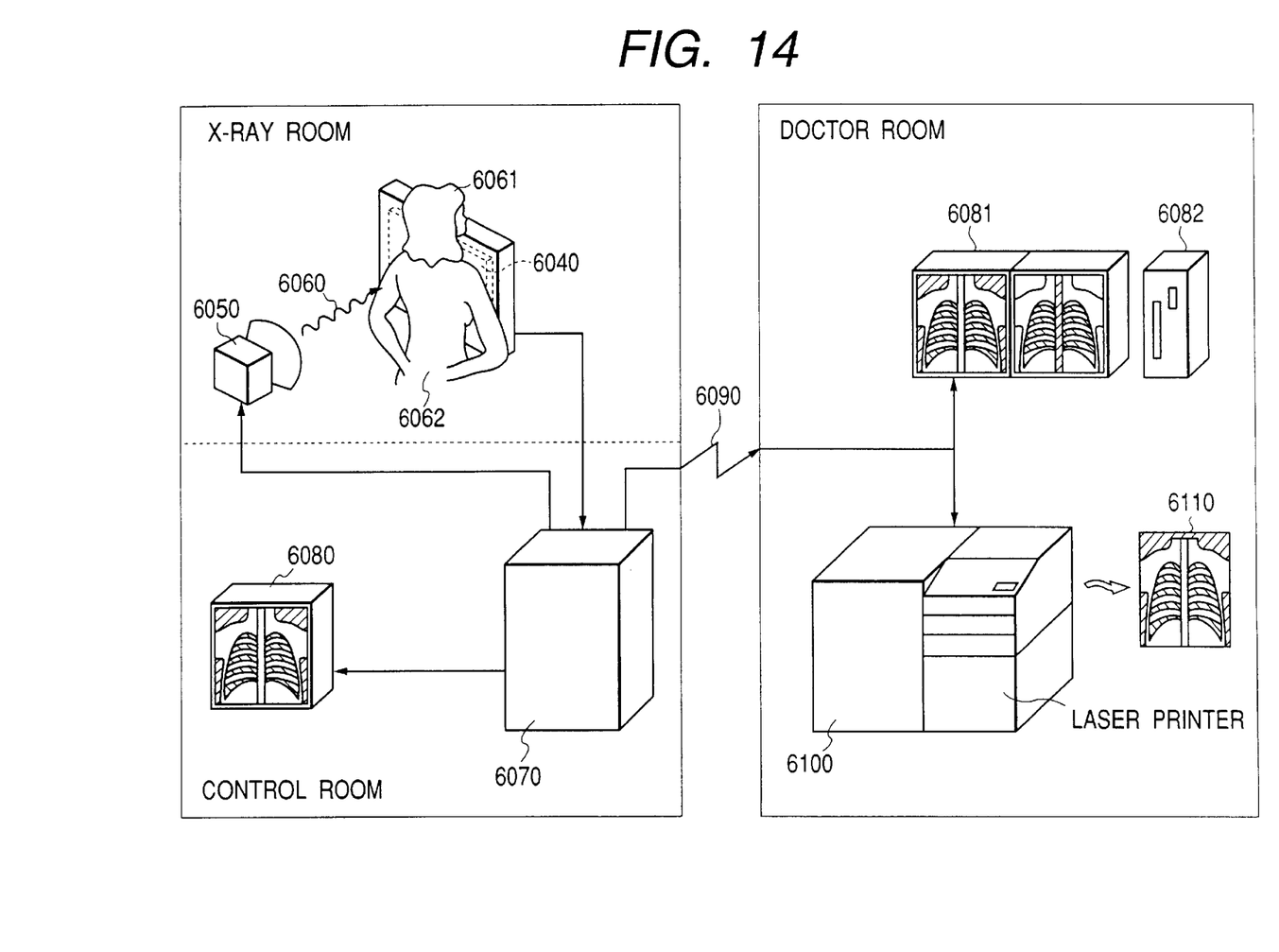
FIG. 14 is a system diagram to show an example of an X-ray diagnosis system.

FIG. 14 shows an application example of the photoelectric conversion apparatus of the present invention to an X-ray diagnosis system.

X-rays 6060 generated in an X-ray tube 6050 pass through a detected part 6062 of a patient or subject 6061 to enter the photoelectric conversion apparatus 6040 with the fluorescent substance mounted thereon. The incident X-rays include information about the inside of the subject 6061. In response to incidence of X-rays the fluorescent substance emits luminescence and this luminescence is photoelectrically converted to electric information. This information is converted to digital data and the digital data is subjected to image processing by image processor 6070 to be able to be observed through a display 6080 in a control room.

This information can also be transferred through a communication means such as a telephone line 6090 or the like to be able to be displayed on a display 6081 in a doctor room or the like at another place or to be stored in a memory means 6082 such as an optical disk or the like, whereby a doctor or an examiner at a remote place can make diagnosis based on the information. The information can also be recorded in a film 6110 by film processor 6100.

As described above, the present invention permits the uniform bias to be applied to the photoelectric conversion elements, by placing the center line of the driving wire of the photoelectric conversion element between the center between signal lines and the center of gravity of the photoelectric conversion element. This permits the film thickness of the transparent electrode to be made smaller, so that the utilization efficiency of the incident light to the photoelectric conversion element can be increased. The photosensitivity of the photoelectric conversion element can be enhanced accordingly.

Therefore, where the photoelectric conversion apparatus of the present invention is applied to the X-ray image pickup apparatus, the necessary dose of radiated X-rays can be decreased in the X-ray digital image pickup apparatus. Thus the present invention can provide the X-ray image pickup apparatus with which the influence by the X-ray radiation is decreased on the human body or on the subject in nondestructive inspection or the like.

What is claimed is:

1. A photoelectric conversion apparatus comprising a plurality of photoelectric conversion elements, a plurality of switching elements connected to said respective photoelectric conversion elements, a plurality of signal lines for outputting electric signals resulting from photoelectric conversion in each of said photoelectric conversion elements, and a plurality of driving wires for driving said photoelectric conversion elements, wherein each of said driving wires is arranged in parallel to said signal lines and between said signal lines, and wherein each of said driving wires is located so that a center line thereof lies between a first position, which is a center between said signal lines, and a second position, which is a center of gravity of a light receiving area of said photoelectric conversion element.

2. The photoelectric conversion apparatus according to claim 1, wherein the center line of said driving wire lies at a center between said first position and said second position.

3. The photoelectric conversion apparatus according to claim 1, wherein a light-transmitting electrode is provided on the light incidence side of said photoelectric conversion elements and wherein said light-transmitting electrode is placed in a part inside the area of each of said photoelectric conversion elements.

4. An image pickup apparatus comprising: a photoelectric conversion apparatus comprising a plurality of photoelectric conversion elements, a plurality of switching elements connected to said respective photoelectric conversion elements, a plurality of signal lines for outputting electric signals resulting from photoelectric conversion in each of said photoelectric conversion elements, and a plurality of driving wires for driving said photoelectric conversion elements; and wavelength conversion means placed on the light incidence side of said photoelectric conversion apparatus, for effecting conversion of incident wavelength and putting light resulting from the wavelength conversion into said photoelectric conversion apparatus, wherein each of said driving wires is arranged in parallel to said signal lines and between said signal lines, and wherein each of said driving wires is located so that a center line thereof lies between a first position, which is a center between said signal lines, and a second position, which is a center of gravity of a light receiving area of said photoelectric conversion element.

5. The image pickup apparatus according to claim 4, wherein the center line of said driving wire lies at a center between said first position and said second position.

6. The image pickup apparatus according to claim 4, wherein a light-transmitting electrode is provided on the light incidence side of said photoelectric conversion elements and wherein said light-transmitting electrode is placed in a part inside the area of each of said photoelectric conversion elements.

7. The image pickup apparatus according to claim 4, wherein said wavelength conversion means is a fluorescent substance.

8. A photoelectric conversion apparatus comprising a plurality of photoelectric conversion elements arrayed in a matrix of rows and columns, each of said photoelectric conversion elements having a transparent electrode disposed on the light incidence side and an electrode opposed to said transparent electrode through a semiconductor layer, first conductive lines connected to the transparent electrodes and disposed along the rows or the columns of the photoelectric conversion elements, and a plurality of second conductive lines provided adjacent to the photoelectric conversion elements and along the first conductive lines, wherein each of the first conductive lines lies between a first position passing through a center between the second conductive lines and in parallel to the second conductive lines and a second position passing through a center of gravity of a light receiving area of the photoelectric conversion element and in parallel to the second conductive lines.

9. The photoelectric conversion apparatus according to claim 8, wherein said first conductive lines are lines for applying a bias voltage to the photoelectric conversion elements.

10. The photoelectric conversion apparatus according to claim 8, wherein said second conductive lines are lines for transferring information resulting from photoelectric conversion in said photoelectric conversion elements.

11. The photoelectric conversion apparatus according to claim 8, wherein each of said photoelectric conversion elements is connected through a transistor to the second conductive line.

12. The photoelectric conversion apparatus according to claim 8, wherein said first conductive lines are lines for applying a bias voltage to the photoelectric conversion elements and said second conductive lines are lines for transferring information from the photoelectric conversion elements.

13. The photoelectric conversion apparatus according to claim 8, wherein said transparent electrode has a smaller area than the semiconductor layer.

14. The photoelectric conversion apparatus according to claim 13, wherein the edge of the transparent electrode is located inside the edge of the semiconductor layer.

15. The photoelectric conversion apparatus according to claim 14, wherein the edge of the transparent electrode is 10 or less μm apart from the edge of the semiconductor layer.

16. The photoelectric conversion apparatus according to claim 8, wherein the transparent electrode is formed in a mesh shape.

17. An image pickup apparatus comprising:
a photoelectric conversion apparatus comprising a plurality of photoelectric conversion elements arrayed in a matrix of rows and columns, each of said photoelectric conversion elements having a transparent electrode disposed on the light incidence side and an electrode opposed to said transparent electrode through a semiconductor layer, first conductive lines connected to the transparent electrodes and disposed along the rows or the columns of the photoelectric conversion elements, and a plurality of second conductive lines provided adjacent to the photoelectric conversion elements and along the first conductive lines, wherein each of the first conductive lines lies between a first position passing through a center between the second conductive lines and in parallel to the second conductive lines and a second position passing through a center of gravity of a light receiving area of the photoelectric conversion element and in parallel to the second conductive lines; and a wavelength conversion element for effecting wavelength conversion of an image-information-carrying signal put into each of the photoelectric conversion elements.

18. The image pickup apparatus according to claim 17, wherein said first conductive lines are lines for applying a bias voltage to the photoelectric conversion elements.

19. The image pickup apparatus according to claim 17, wherein said second conductive lines are lines for transferring information resulting from photoelectric conversion in said photoelectric conversion elements.

20. The image pickup apparatus according to claim 17, wherein each of said photoelectric conversion elements is connected through a transistor to the second conductive line.

21. The image pickup apparatus according to claim 17, wherein said first conductive lines are lines for applying a bias voltage to the photoelectric conversion elements and said second conductive lines are lines for transferring information from the photoelectric conversion elements.

22. The image pickup apparatus according to claim 17, wherein said transparent electrode has a smaller area than the semiconductor layer.

23. The image pickup apparatus according to claim 17, wherein the edge of the transparent electrode is located inside the edge of the semiconductor layer.

24. The image pickup apparatus according to claim 17, wherein the edge of the transparent electrode is 10 or less pm apart from the edge of the semiconductor layer.

25. The image pickup apparatus according to claim 17, wherein the transparent electrode is formed in a mesh shape.

26. The image pickup apparatus according to claim 17, wherein said wavelength conversion element comprises a fluorescent substance.

* * * * *

UNITED STATES PATENT AND TRADEMARK OFFICE
CERTIFICATE OF CORRECTION

PATENT NO. : 6,753,915 B1
DATED : June 22, 2004
INVENTOR(S) : Chiori Mochizuki

It is certified that error appears in the above-identified patent and that said Letters Patent is hereby corrected as shown below:

Column 1,
Line 54, "crossectional" should read -- cross-sectional --.

Column 6,
Line 57, "10 pm" should read -- 10$\mu$m --.

Column 10,
Line 52, "pm" should read -- $\mu$m --.

Signed and Sealed this

Twenty-second Day of March, 2005

JON W. DUDAS
*Director of the United States Patent and Trademark Office*